United States Patent [19]

Tucker et al.

[11] 4,359,690

[45] Nov. 16, 1982

[54] MICROWAVE STORAGE DEVICE

[75] Inventors: Trevor W. Tucker, Ottawa; Larry J. Conway, Kanata; Sylvain L. Bouchard, Gatineau, all of Canada

[73] Assignee: Her Majesty the Queen in right of Canada, as represented by the Minister of National Defence, Ottawa, Canada

[21] Appl. No.: 169,725

[22] Filed: Jul. 17, 1980

[30] Foreign Application Priority Data

Dec. 21, 1979 [CA] Canada .................................. 342527

[51] Int. Cl.$^3$ ...................... H03K 5/13; G11C 27/02; H03K 5/159
[52] U.S. Cl. .................................. 328/151; 307/353; 328/56; 328/65; 328/164
[58] Field of Search ................ 307/353; 328/151, 164, 328/56, 65

[56] References Cited

U.S. PATENT DOCUMENTS

| 3,305,785 | 2/1967 | Carroll, jr. | 328/56 |
| 3,484,689 | 12/1969 | Kerns | 328/151 |
| 3,843,926 | 10/1974 | Espenlaub et al. | 328/151 |

Primary Examiner—John Zazworsky
Attorney, Agent, or Firm—Larson and Taylor

[57] ABSTRACT

This invention relates to a system for storing a pulse modulated radio frequency signal and for accessing and reconstructing the stored signal repetitively whereby it can be retransmitted as desired, either at the same frequency or at a shifted or shifting frequency. An input delay line is sampled at a plurality of locations and the signal samples are stored by a plurality of capacitors. The capacitors are accessed at will and the stored samples are applied to locations on an output delay line similar to the input delay line, where the input signal is reconstructed.

23 Claims, 3 Drawing Figures

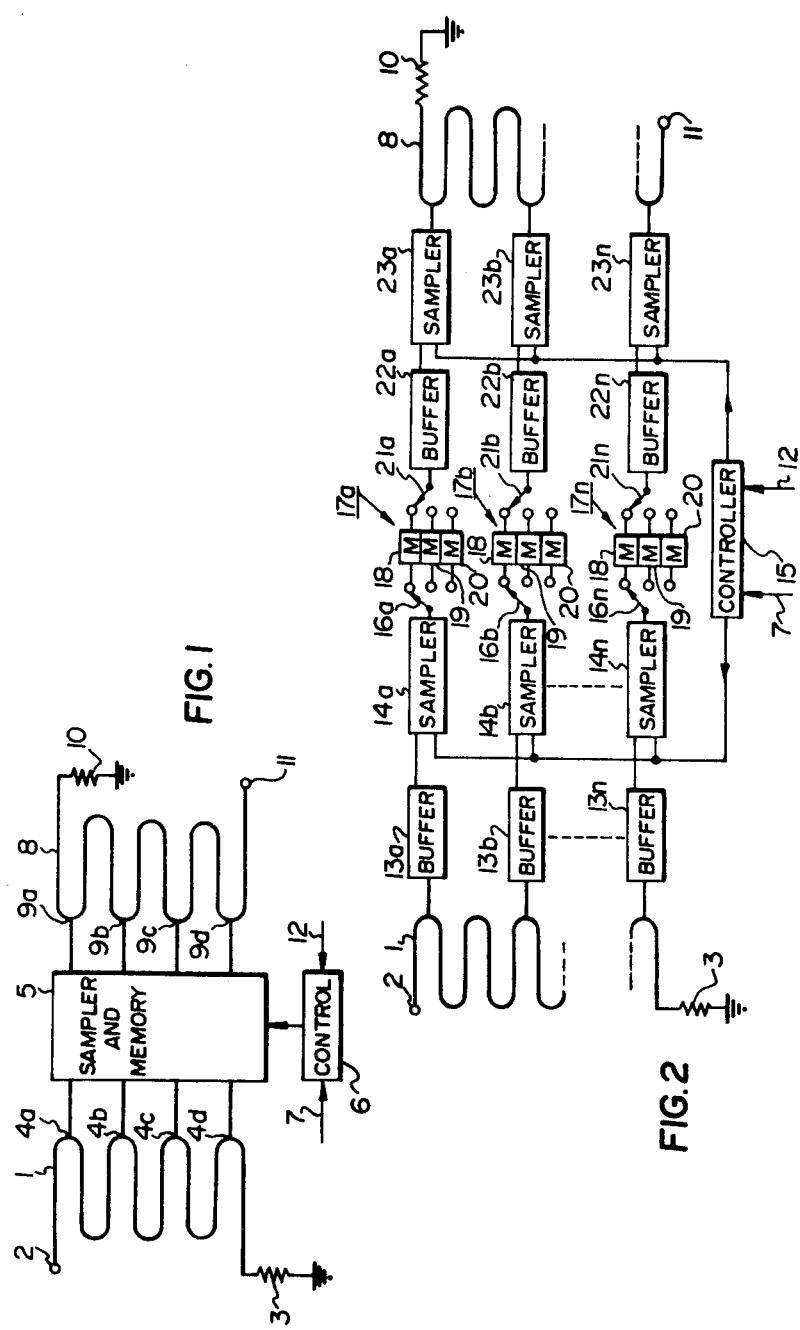

MICROWAVE STORAGE DEVICE

This invention relates to a system for receiving and coherently storing a radio frequency signal, and more particularly to a system for storing a pulse modulated radio frequency signal and for accessing and reconstructing the stored signal repetitively whereby it can be cyclically retransmitted.

This type of system can be useful in the formation of wideband amplifiers, programmable high frequency delay lines, microwave storage devices, radar jammers, etc.

One known system for effecting signal reconstruction is to introduce a period of a received high frequency input signal into a memory loop. Usually the memory loop includes an acoustic delay line in series with a travelling wave tube. After the signal is introduced, the input signal path is opened while the signal circulates in the memory loop. As it circulates, it is sensed in an output circuit, and thus can be reconstructed once or repetitively as desired. Once the signal has been reconstructed and applied to other circuitry the required number of times, the input signal path is closed and another period of the input signal is introduced into the memory loop.

A difficulty with the above-noted system is that phase coherence can be retained only if the memory loop delay is equal to or greater than the period of the input signal. If the period of the input signal is longer than the memory loop delay, the leading edge of the input signal will overlap the trailing edge of the recirculated signal, giving rise to interference which destroys phase coherence.

A further difficulty is that the stored signal can be properly recalled only at increments in time which correspond to the recirculation time in the loop.

A third difficulty is that after a relatively few recirculations in the memory loop (e.g. twenty) noise can build up therein effectively masking the stored signal. Accordingly use of the recirculating memory loop has been restricted to a relatively short memory time.

A second form of system of the above type digitally stores the input signal. The received radio frequency input signal is down-converted to an intermediate frequency by local oscillator mixing, and it is then sampled, digitized, and stored in a digital memory after the analog to digital conversion. The input signal is reconstructed by performing a digital to analog conversion on the stored contents of the digital memory, by which the intermediate frequency signal is obtained. This signal is then up-converted, reproducing the original radio frequency signal.

However this system has an upper frequency limitation which is set by the speed of present day digitization circuitry, and consequently is limited to several hundred megahertz.

Another problem is encountered during digitization of the signal into discrete values. Quantization noise is introduced, which corrupts the quality of retention of phase coherence. Poor input-output signal stability can sometimes also become a problem.

The present invention on the other hand provides means for storage of the input signal in a manner which allows repetitive reconstruction thereof at times not related specifically to the period of the input signal, as desired. The aforenoted noise and stability problems are substantially avoided, and as well the system allows the preservation of phase coherence. Accordingly the desired retransmission of a received and stored input signal repetitively at the same frequency without noise or phase-shift degradation can now substantially be achieved. In addition, in one of the embodiments of the present invention, means is provided for shifting the frequency of the output signal relative to the input signal.

Further, the input signal frequencies which can be handled are substantially in excess of those in the aforenoted digital storage technique, since the operation of solid state devices in the present invention involves only a sampling frequency, which is not as high as the frequency of the signal itself.

In general the invention is signal translation means comprising an input delay line for carrying an input signal, means for receiving samples of the input signal at predetermined points along the delay line, and means for storing the samples.

More particularly the invention further includes a plurality of analog memory means, each having a plurality of storage locations for storing signals corresponding to the amplitudes of the samples. Further circuitry is included for switching the samples from each of the points to successive ones of the storage locations in the analog memory means corresponding to each of the points, at first predetermined times. This embodiment includes an output delay line similar to the input delay line for providing an output signal, and a circuit for switching each of the storage locations of individual ones of the memory means to second predetermined points along the output delay line which correspond to the first predetermined points, at second predetermined times, whereby the input signal can be reconstituted in the output delay line.

It is preferred that each of the storage locations should include a capacitor for storing a sample voltage therein.

The output delay line can include a plurality of distributed capacitors, to provide an effective decrease in velocity of wave propagation, thus decreasing the output frequency. The distributed capacitors can be of voltage variable type, thus affording means for varying the output signal frequency at will.

A better understanding of the invention will be obtained by reference to the detailed description below, and to the following drawings, in which:

FIG. 1 is a block schematic of a first embodiment of the invention,

FIG. 2 is a block schematic of the preferred embodiment of the invention, and

Figure 3:
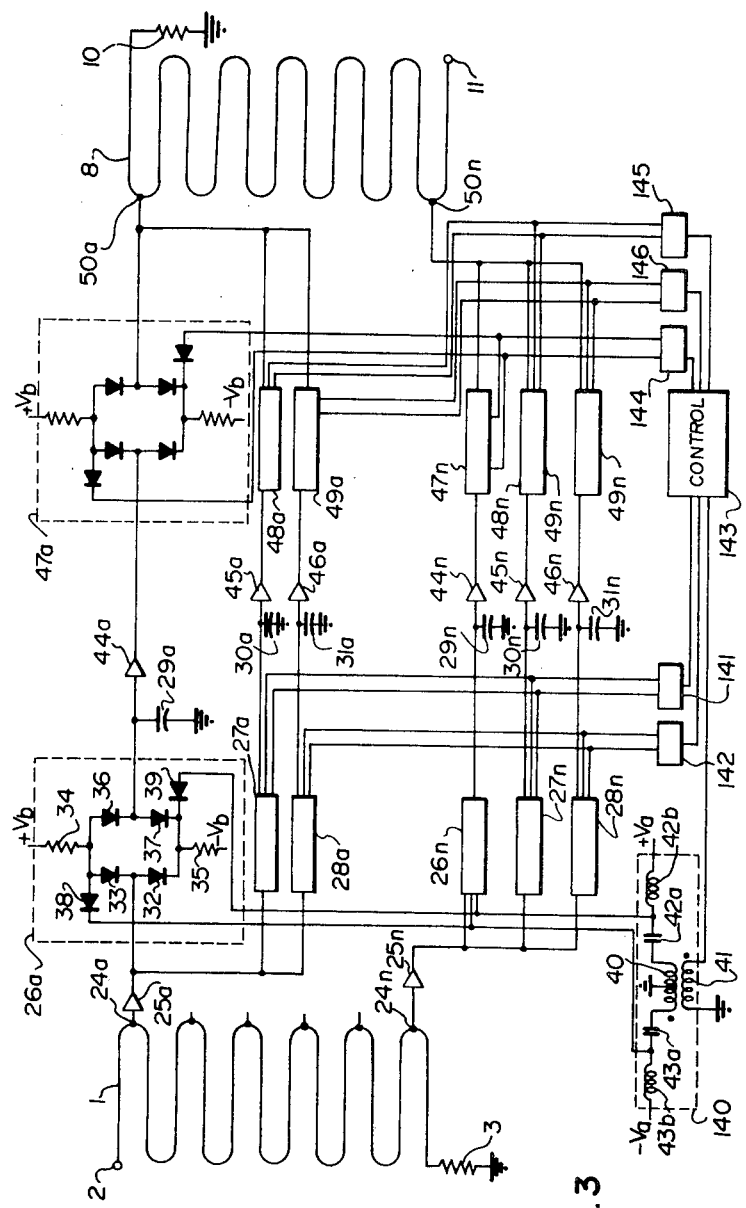
FIG. 3 is a schematic diagram of the preferred embodiment of the invention.

Turning now to FIG. 1, one embodiment of the invention is shown comprised of an input delay line 1, having a terminal 2 at one end to which input signals are applied, and a load 3 connected to its other terminal. At predetermined locations 4A, 4B, 4C, and 4D the delay line is tapped, at which points samples of the signal traversing therethrough are obtained.

The samples of the signal are applied to a sampler and memory circuit 5 for storage.

A control circuit 6 is connected to the sampler and memory circuit for timing the reception of samples from the delay line 1. Input 7 is provided to which read pulses can be applied for causing the control 6 to sample at the appropriate time.

In operation, a radio signal such as a received microwave frequency radar pulse is applied to input terminal 2, and passes down the delay line 1. When it has reached load 3, or after a complete pulse has been received, (assuming the pulse time is shorter than the delay in delay line 1,) a read control signal is applied to input 7 of control circuit 6. In response control circuit 6 causes the sampler to open its internal gates connected to the predetermined tap locations 4a–4d of the input delay line 1, for a short time period. During this time period the signal voltages at the predetermined locations 4a, 4b, 4c and 4d are applied to the memory, and the voltage samples are stored.

To obtain an output signal, an output delay line 8 is used, which is similar to input delay line 1. The output delay line is tapped at predetermined locations 9a, 9b, 9c, and 9d which correspond to locations 4a, 4b, 4c, and 4d of the input delay line. The taps are connected via output gates to the memory locations in the sampler and memory 5. The output delay line 8 is terminated by a load 10 and output terminal 11.

To write the stored signal onto the output delay line, a write control signal is applied to the write input 12 of control circuit 6. This causes the output gates in sampler and memory 5 to allow the leads connected to locations 9a, 9b, 9c, and 9d on the output delay line 8 to open, whereupon the individual voltage samples stored in the memory are applied to delay line 8. The result is a reconstructed replica of the input pulse, which passes down the output delay line. The output signal can be sensed at output terminal 11.

The fidelity of the output signal can be increased by increasing the number of delay line taps and memory locations.

Repetitively applying a write signal to control circuit 6 causes repetitive reconstruction of the same stored radar pulse as described above. As long as the memory is adequately buffered from the output delay line, the stored signal will not be lost and repetitive reconstruction of the stored signal can be effected, and retransmitted as desired.

The contents of the memory can be changed by providing a read signal to the control circuit, causing the sampler to again access the predetermined locations 4a, 4b, 4c, and 4d of the input delay line. The new output signal can subsequently be reconstructed as many times as desired as described earlier.

It is known by persons skilled in the art that the signal propagation velocity in a delay line can be decreased by utilizing distributed capacitors therewith. By the use of such capacitors with the output delay line, the frequency of the output signal can be decreased relative to the input signal.

Should voltage variable capacitors such as varactor diodes be used as the distributed capacitors, the frequency of the output signal relative to the input frequency can be varied merely by varying the voltage applied to the capacitors. Indeed, the frequency of the reconstructed signal can be made to shift as it passes down the output delay line, which would give a pseudo doppler effect thereto, and thus can be useful in a radar countermeasures system.

The system of FIG. 1 is satisfactory where the delay of the delay line is equal to or greater than the pulse width of the input pulse. However, where the input pulse length is greater than the delay time of the delay line, a system such as the one shown in FIG. 2 is preferred. In this embodiment, the input delay line 1 is connected to an input terminal 2 and load 3 as in FIG. 1. In FIG. 2 the buffer amplifiers incorporated in the sampler and memory 5 are shown separately, as buffers 13a, 13b . . . 13n. These buffers are representative of isolation networks and may take on various other forms (e.g. couplers). In some applications the buffers may even be eliminated.

The outputs of buffers 13a–13n are respectively connected to the inputs of samplers 14a, 14b . . . 14n. The samplers (which are preferably transmission gates), are enabled by a controller 15.

The outputs of samplers 14a, 14b . . . 14n are connected via corresponding switches 16a, 16b . . . 16n to memories 17a, 17b . . . 17n. Each memory is comprised of storage locations 18, 19, 20, etc. Storage locations 18, 19, and 20 of memory 17a have their inputs connected to the output terminals of switch 16a; the input terminals of storage locations 18, 19 and 20 of memory 17b are connected to the terminals of switch 16b, etc. The input (or moving contact equivalent) of switches 16a, 16b, etc. are each connected to the output of samplers 14a, 14b, etc.

Similarly, the output terminals of storage locations 18, 19 and 20 of memory 17a are connected to the terminals (or contact equivalents) of switch 21a, the output terminal (or moving contact equivalent) of which is connected to the input of buffer 22a. The output terminals of storage locations 18, 19, and 20 of memory 17b are connected to the terminals of switch 21b, the output terminal of which is connected to the input of buffer 22b. In a similar manner all of the storage locations are connected as memory 17n is connected to the terminals of switch 21n, the output of which is connected to the input of buffer 22n. Buffers 22a, 22b . . . 22n preferably are amplifiers.

The outputs of buffers 22a, 22b . . . 22n are respectively connected to the inputs of samplers 23a, 23b . . . 23n, the outputs of which are connected to the taps on output delay line 8 which are at similar locations as the taps of input delay line 1. The write control is provided from controller 15 as in controller 6, and enables samplers 23a–23n.

In operation, let us assume that an input pulse which has a pulse width which is longer than the delay time of delay line 1 appears at input terminal 2. At the time when the signal reaches load 3 (controlled by external circuitry not part of this invention), controller 15 enables samplers 14a–14n. This allows the signal potentials at the sampling taps to pass via buffers 13a–13n through samplers 14a–14n, through the first contact of switches 16a–16n as shown into storage locations 18 of memories 17a–17n. Thus the potential of the signal at the first tap of the delay line 1 is stored in storage location 18 of memory 17a; the potential of the signal at the second tap of input delay line 1 is passed through buffer 13b, sampler 14b and the first contact of switch 16b to storage location 18 of memory 17b, and so on.

Buffers 13a–13n, should have such matching properties that the integrity of the signal passing through delay line 1 is retained. The enabling period for samplers 14a–14n should be very short relative to the period of the input frequency of the r.f. carrier of the pulse, in order that the particular potential at the tap point of the delay line only at a particular instant should be applied to the memory location. Preferably there should be at least 2 samples for each r.f. cycle.

The samplers 14a–14n may either be implemented as sampling or as tracking networks. In the case of a tracking network a very sharp cutoff transition relative to the input frequency is sufficient to achieve proper sampling.

As the input signal continues to pass down delay line 1, the portion which previously was at input terminal 2 eventually appears at the input to load 3, and a second portion of the input signal pulse immediately following the first portion now is present within the delay line. External circuitry causes switches 16a-16n to move to their second contact points, and controller 15 enables the operation of samplers 14a-14n for a second brief interval. Again samples of the input signal potentials appearing at the taps of the input delay line pass through buffers 13a-13n, samplers 14a-14n, and switches 16a-16n, but this time are stored in memory locations 20 of memories 17a-17n.

The input signal continues to pass through delay line 1 to load 3, and the immediately following third portion of the input signal appears within delay line 1. Switches 16a-16n are moved to their third contact position, controller 15 causes the enabling of samplers 14a-14n, and samples of the third portion of the signal potential are stored in storage locations 19 of memories 17a-17n as before.

Assuming that the entire signal has now been passed through the delay line, it will be seen that individual samples of the three succeeding portions of the input signal are stored in storage locations 18, 19 and 20 of memories 17a-17n.

Of course the number of storage locations used will be dependent on the expected length of the input signal, and the complexity of switches 16a-16n will be commensurate therewith. The switches may be solid state switches which are fast acting, and pulse enabled.

Switches 21a, 21b . . . 21n operate in a manner similar to switches 16a-16n, to access storage locations 18, or 19, or 20. To reconstruct the output signal, storage locations 18 are accessed in each memory, and samplers 23a-23n are enabled by controller 15. The signal samples stored at storage locations 18 are applied via buffers 22a through 22n, through samplers 23a-23n 1 to points on the output delay line 8 corresponding to the tap points of input delay line 1. Buffers 22a-22n, having high impedance inputs, guard against the deterioration in the potentials of the samples in the memory storage locations.

The first portion of the input signal is thus reconstructed in output delay line 8, and passes therethrough to output terminal 11.

Switches 21a-21n are then switched so as to access storage locations 19 of memories 17a-17n, and the controller 15 causes the brief enabling of samplers 23a-23n. The signal samples in storage locations 19 of each memory are thus passed through buffers 22a-22n and samplers 23a-23n to the output delay line 8. The second portion of the signal is thus reconstructed and passes down delay line 8 to output terminal 11. The timing of the second enabling of samplers 23a-23n should of course be just following the time period for the first third of the signal to have passed down the delay line.

Again switches 21a-21n are switched so as to access storage locations 20 of memories 17a-17n. Just as the end of the second third of the signal passes down output delay line 8 to output terminal 11, the samplers 23a-23n are enabled by controller 15, and as before the third portion of the input signal is reconstructed in the output delay line.

In the event it is desired to minimize reflections in the output delay line, the output load 10 should be matched to the characteristic impedance of the delay line.

In the above manner the entire input signal is reconstructed in the output delay line, and is made available at output terminal 11 for retransmission, e.g. to a radar receiver.

It should also be noted that the time of accessing of the stored signal can be made simultaneous with the storage of the signals, or can be later. The stored signal can be accessed repetitively, and thus a reproduction of the entire input pulse can be reconstructed repetitively.

The embodiment just described can also utilize the distributed capacitors described with reference to FIG. 1, whereby a frequency shifted and/or frequency shifting output signal can be produced.

FIG. 3 shows a detailed schematic of the preferred embodiment of the invention. Input delay line 1 has an input terminal 2 and is connected to a load 3, as in FIGS. 1 and 2. Representative sampling points 24a and 24n are shown as the first and last in the delay line. The sampling points are connected to the inputs of buffer amplifiers 25a-25n which have their outputs connected to individual samplers and switches as follows.

In the case in which only a single memory storage location per sampling point is required (i.e. the input pulse length does not exceed the delay line length), each buffer amplifier has its output connected to the input of a corresponding sampler and switching circuit 26a-26n. However, where a plurality of storage locations for each sampling point is required, as described with reference to the system of FIG. 2, additional sampler and switching circuits 27a-27n, 28a-28n, etc. are used. The inputs of all of samplers 26a, 27a, and 28a are connected to the output of buffer 25a, the inputs of all of the samplers 26b, 27b, 28b (not shown) are connected to the output of buffer 25b (not shown), etc., and the inputs of sampler and switching circuits 26n, 27n, and 28n are all connected to the output of buffer amplifier 25n.

The output of each sampler and switching circuit 26a, 27a, 28a is connected to an individual capacitor 29a, 30a and 31a respectively, etc., and the output of each sampler and switching circuit 26n, 27n, 28n is connected to an individual capacitor 29n, 30n and 31n respectively. Each of the capacitors forms a storage location for the signal potential which is switched to it.

Each capacitor is connected to the high impedance input of a buffer amplifier 44a-44n, 45a-45n, 46a-46n, and as will be described later, the charge on each capacitor is thus retained as long as the circuits connected thereto are also high impedance.

A representative sampler and switching circuit is shown in the dashed outline block 26a. The output of buffer amplifier 25a is connected to the junction of a pair of series connected diodes 32 and 33 which are poled in the same direction. The anode of diode 33 is connected to a potential source $+V_b$ through a resistor 34, and diode 32 is connected to a source of potential $-V_b$ through a resistor 35. A pair of series connected similarly poled diodes 36 and 37 are also connected in the forward conducting direction between the potential source $+V_b$ and $-V_b$. The junction of diodes 36 and 37 is connected to the input of buffer 44a.

The aforenoted circuit forms a sampler which is connected to a switching circuit comprised of a pair of diodes 38 and 39. The anode of diode 38 is connected to the anodes of diodes 33 and 36, and the cathode of diode 39 is connected to the cathodes of diodes 32 and 37.

It should be noted that each of the sampler and switching circuits 26a, 28a, 29a . . . 26n, 27n, 28n referred to in FIG. 3 contains similar circuitry.

The anode of diode 39 and the cathode of diode 38 are both connected to the output leads of a pulse forming network 140. The network is comprised of a transformer having a centre tapped secondary winding 40 and a primary winding 41. The centre tap of winding 40 is connected to ground. The opposite leads of winding 40 are each connected through capacitors 42a and 43a and inductors 42b and 43b to sources of potential $-V_a$ and $+V_a$. The anode of diode 39 is connected to the junction of capacitor 42a and inductor 42b, and the cathode of diode 38 is connected to the junction of capacitor 43a and inductor 43b. One terminal of primary winding 41 is connected to ground and the other terminal is connected to a control source of read pulses.

The junctions between capacitors 42a and 43a and inductors 42b and 43b are the output leads of the pulse forming network 140. The output lead connected through inductor 42b to source of potential $+V_a$ is connected to the anode of diode 39, and the other output lead is connected to the cathode of diode 38. These output leads are similarly connected to corresponding diodes of sampler and switching circuits 26a-26n. Similar pulse forming networks 141 and 142 are respectively connected to the corresponding diodes of sampler and switching circuits 27a-27n, and sampler and switching circuits 28a-28n. Pulse forming network 140 is therefore adapted to switch circuits 26a-26n, pulse forming network 141 is adapted to switch sampler and switching circuits 27a-27n and pulse forming network 142 is adapted to switch sampler and switching networks 28a-28n.

In operation, consider first sampler and switching circuit 26a. Initially, diodes 38 and 39 are in their forward conduction mode, since they are forward biased from source of potential $+V_a$, through inductor 42b, diode 39, resistor 35 to source of potential $-V_b$, and from source of potential $+V_b$, through resistor 34, diode 38, inductor 43b to source of potential $-V_a$.

A signal is received from input terminal 2 and is carried by the delay line through load 3 to ground. Accordingly a sample of the signal waveform appears as a potential at the output of buffer 25a, and at the junction of diodes 32 and 33. Since diodes 38 and 39 are forward biased, the anode junctions of diodes 33, 36 and 38 are nearly at potential $-V_a$, and the cathodes of diodes 32, 37 and 39 are nearly at the potential $+V_a$. Clearly diodes 32 and 33, and 36 and 37 are back biased, and therefore non-conductive.

A read pulse is now provided from control circuit 143, and passes down primary winding 41. Winding 40 inverts the pulse direction and during the period of the pulse, the junction of capacitor 42a and inductor 42b goes to a negative potential, and the junction of capacitor 43a and inductor 43b goes to a positive potential. This effectively reverse biases diodes 38 and 39, stopping conduction thereof. Diodes 32, 33, 36 and 37 become forward biased from potential $+V_b$ through resistor 34, resistor 35 to potential $+V_b$. During this time period the input signal potential appearing at the junction of diodes 32 and 33 also appears at the junction between diodes 36 and 37, and is stored in capacitor 29a.

Once the read pulse applied to primary winding 41 of the transformer has been completed, diodes 38 and 39 become forward biased again, effectively shutting off conduction of diodes 32, 33, 36 and 37. Since the latter diodes are back biased, they are non-conductive, and the junction of diodes 36 and 37 is at high impedance with respect to ground. The charge on capacitor 29a, thus having a high impedance at the junction of diodes 36 and 37 and also at the input of buffer 44a, retains its charge and becomes an effective storage element.

It was noted earlier that the output leads of pulse forming network 140 are connected to all of sampler and switching circuit 26a-26n. Since the inputs thereto are all connected to taps of input delay line 1, and all are enabled from pulse forming network 140, all of the capacitors 29a-29n receive charges corresponding to samples at different portions of the input waveform which is within the input delay line. The time of the read pulse applied to primary winding 41 thus establishes the read interval of the input waveform.

For the case in which the input waveform is longer than the delay line period, additional sampling and switching circuits 27a-27n, 28a-28n, etc. as described above are used. Let us assume for this explanation that the input waveform is 3 times the time period of the input delay line period. As the input signal passes down delay line 1, and reaches load 3, a read pulse is applied by control 143 to primary winding 41 of the transformer connected to sampler and switching circuits 26a-26n. The corresponding samples of the first third of the input waveform are thus stored on capacitors 29a-29n as described above.

The second third of the input waveform passes down input delay line 1 and reaches load 3. At this time a second pulse is applied to pulse forming network 141. In a similar manner as described with respect to pulse forming network 140, sampler and switching circuits 27a-27n are enabled. Accordingly samples of the second third of the waveform appearing at sampling points 24a-24n pass through sampling and switching circuits 27a-27n and are stored in capacitors 30a-30n.

The third third of the input signal waveform passes down input delay line 1, and a read pulse is applied to pulse forming network 142. Sampler and switching circuits 28a-28n thus become enabled, and the input signal waveform samples at sampling points 24a-24n pass through sampler and switching circuits 28a-28n and are stored in capacitors 31a-31n. The sampling rate should be at the Nyquist sample frequency divided by n, i.e., a minimum of two times the highest frequency expected divided by n, n being the number of delay line taps.

It should be noted that inductors 42b, 43b and their equivalents in the other pulse forming networks isolate the d.c. voltage sources from the output leads. Secondary winding 40 is isolated from the d.c. voltage sources by capacitors 42a and 43a.

To read out the stored signal samples, output sampler circuits are used. Samplers 47a, 48a and 49a have their inputs respectively connected to the outputs of buffers 44a, 45a, and 46a, etc. Sampler circuits 47n, 48n and 49n have their inputs connected to the outputs of buffers 44n, 45n and 46n. The outputs of samplers 47a, 48a and 49a are connected together and to tap 50a on an output delay line 8. Output delay line 8 is similar to input delay line 1, and has taps at similar locations, i.e., tap 50a is similar to tap 24a, etc., and tap 50n is similarly located as tap 24n. Output delay line 8 has output terminal 11 at one end thereof, and is connected to load 10 at its other end. Samplers 47n, 48n and 49n have their outputs connected together to tap 50n of output delay line 8.

Pulse forming networks 144, 145 and 146 are connected between control circuit 143 and the sampler circuits just described. The latter pulse forming networks are similar to pulse forming networks 140, 141 and 142. The output leads of pulse forming network 144 are connected to the diodes of samplers 47a–47n which are similar to diodes 38 and 39 of sampler and switching network 26a. Similarly, the output leads of pulse forming network 145 are connected to samplers 48a–48n and the output leads of sampler 146 are connected similarly to sampler circuit 49a–49n.

The output sampler circuits operate similarly as the above-described sampler and switching circuits. For operation, control circuit 143 provides a write pulse first through pulse forming network 144. Accordingly samplers 47a–47n are enabled. The stored charge on capacitors 29a–29n thus can pass through buffers 44a–44n and samplers 47a–47n and appear at the taps 50a–50n of output delay line 8. The signal samples thus recreate the input signal, and with suitable filtering, a ripple-free analog output signal is provided.

Where signal portions are also stored on capacitors 30a–30n and 31a–31n, first samplers 47a–47n are enabled as described above. A following write pulse is applied to pulse forming network 145, which enables samplers 48a–48n. The charge stored on capacitors 30a–30n are then applied to taps 50a–50n in a similar manner as described above. Again, a write pulse is applied from control circuit 143 to pulse forming network 146, which enables sampler circuits 49a–49n. The signals stored by capacitors 31a–31n are thus applied to taps 50a–50n in a similar manner.

Clearly the three thirds of the input signal have been sequentially applied to all of the taps 50a–50n of the output delay line 8. Of course, the number of storage capacitors per delay line tap described herewith as 3 can be any suitable number.

It is preferred that buffers 44a–44n, 45a–45n and 46a–46n should have some gain, in order to cause the entire circuit to exhibit gain.

If there is some delay before output writing of the stored charges, the stored charges can be built up before dumping them into the output delay line. In this case rather than the buffers 44, 45 and 46, amplifiers should be used having low-current handling capabilities, while providing a high power output to the output delay line.

In addition, storage capacitors connected to the output of the buffers 44, 45 and 46 could be used to augment the power handling capability, by obtaining both a boost in voltage and also a boost in current as a result of the amplification obtained in the noted buffers.

In order to reduce the length of the input delay line, for square wave input pulses the high level period of the input pulses can be sampled, and the low level period not sampled, with appropriate control circuitry. For a 50% duty cycle high level period of an input pulse, the input delay line need only be half the input pulse length. The output pulse can be reconstructed completely in the timing of the outputting of the stored signal.

It should be noted that the sampling pulse signal carrying lines connected to the sampling and switching gates themselves have delay, which becomes very evident at very high frequencies such as at gigahertz frequencies. The timing of the sampling at each individual gate should take the delay of the conductive lines into account. Alternatively, the delay lines can be lengthened or shortened to take this delay into account.

Clearly as described with reference to FIGS. 2 and 3, distributed fixed or voltage variable capacitors can be used in conjunction with the input and/or output delay lines to cause the signal velocity to vary therein, thus causing a change in frequency of the output signal relative to the input signal. The input and output delay lines can be of coaxial, printed circuit board, or surface acoustic wave types, and the sampler and switching gates can be transistor or field effect transistor or other suitable switches.

The above-described invention demonstrates the use of a delay line to distribute a radio frequency wave along its length, while the resulting distributed voltage is sampled at various points along the line. The number of points to which are sampled, of course, would be determined by the desired resolution of the output signal.

The sample voltages are stored in an analog memory, and the input signal is reconstructed by imposing samples of the stored sample voltages in a distributed manner along the output delay line. The system thus provides the means for receiving, storing and retransmitting the input radio frequency signal.

Undesired frequency shifting as observed in both the prior art memory loop and digital storage devices is eliminated. Further, because the present system utilizes semiconductor devices, the desirable characteristics of high reliability and inexpensive construction is achieved. Further, the system allows amplification between the input and reconstructed output signals. It also provides means for shifting of the frequency, and variation of the output frequency as the reconstructed signal is passed down the delay line.

It is thus clear that the present invention can be utilized in satellite and communications transponders, filters, wide band amplifiers, programmable high frequency delay lines, microwave storage devices, radar jammers, etc. Application in these kinds of apparatus will become obvious to a person skilled in the art understanding this invention. For example, the signals stored by the capacitors can be applied to a computer for further processing, rather than applying them to a delay line.

A person skilled in the art understanding this invention may now conceive of alternative embodiments or variations thereof. All are considered within the sphere and scope of this invention, as defined in the claims appended hereto.

The embodiments of the invention in which an exclusive property or privilege is claimed are defined as follows:

1. Signal translation means comprising an input delay line means for distributing said signal, means for sampling the amplitude of the distributed signal at predetermined points along the delay line means, amplifier means for amplifying the samples taken at said predetermined points along the delay line means, means for storing the samples, output delay line means similar to the input delay line means, and means for applying the stored samples to the output delay line means at points corresponding to said predetermined points.

2. Signal translation means as defined in claim 1, in which said applying means is adapted to apply the stored samples to said corresponding points.

3. Signal translation means as defined in claim 1 or 2, further including first means for switching said sampling means from the storage means to alternative storing means at first predetermined times following the reception of said signal by the delay line means.

4. Signal translation means as defined in claim 1 or 2, further including first means for switching said sampling means from the storage means to alternative storing means at first predetermined times following the reception of said signal by the delay line means and second means for switching said storage means and alternative storage means sequentially at second predetermined times to said corresponding points.

5. Signal translation means comprising:
   (a) an input delay line for distributing an input signal,
   (b) means for sampling the amplitude of said distributed signals at first predetermined points along the input delay line,
   (c) a plurality of analog memory means, each having a plurality of storage locations for storing a signal corresponding to the amplitude of said samples,
   (d) means for switching said samples from each said point to successive ones of said storage locations in sequence of corresponding analog memory means, at first predetermined times,
   (e) an output delay line similar to the input delay line for providing an output signal,
   (f) means for switching each of the storage locations of individual ones of said memory means to second predetermined points along the output delay line which correspond to said first predetermined points, at second predetermined times,
   whereby the input signal can be reconstituted in the output delay line.

6. Signal translation means as defined in claim 5, in which the first predetermined times correspond to the delay time of the input delay line, and the second predetermined times correspond to the delay time of the output delay line.

7. Signal translation means as defined in claim 6, in which the input and output delay lines have similar delay times.

8. Signal translation means as defined in claim 5 in which output delay line has a delay time different than the input delay line.

9. Signal translation means as defined in claim 5, 6 or 7, in which each storage location is comprised of a capacitor.

10. Signal translation means as defined in claim 1 or 5, further including capacitors distributed along one of said delay lines connected between predetermined points on the delay line and ground, for providing an effective variation in velocity of wave propogation from the delay line of similar length devoid of said capacitors.

11. Signal translation means as defined in claim 5, further including voltage variable capacitors distributed along at least one of said delay lines connected between predetermined points on the delay line and ground, for providing effective variations in velocity of wave propogation on the delay line as voltage applied to said capacitors if varied.

12. Signal translation means comprising:
   (a) an input delay line for distributing an input signal,
   (b) means for sampling the amplitude of said signal at first predetermined points along the input delay line,
   (c) analog memory means comprising a plurality of capacitors each adapted to store a signal corresponding to the amplitude of a sample,
   (d) first means for switching the samples from each said point to corresponding ones of capacitors,
   (e) an output delay line similar to the input delay line for providing an output signal,
   (f) output means for sampling and thereby connecting each of the memory means to said predetermined points along the output delay line which correspond to said first predetermined points,
   whereby the samples are applied to the output delay line for reconstituting the input signal therein.

13. Signal translation means as defined in claim 12, further including a plurality of buffer amplifiers each having its input connected to one of said capacitors and its output connected to one of said output sampling means.

14. Signal translation means as defined in claim 12 or 13, in which the first switching means is comprised of a plurality of diode gates, each one in a circuit for switching each sample from the input delay line to a corresponding capacitor, and further including means for enabling said gates at selected times.

15. Signal translation means as defined in claim 12, in which the first switching means is comprised of a first plurality of groups of diode gates, all of the inputs of the gates of each individual group being connected together, the inputs of the various groups being connected in individual circuit paths for switching a sample from individual predetermined points on the input delay line to individual capacitors each one connected to the output of a diode gate, further including means for enabling all of the correspondingly ranked gates of all of the groups together, in sequence, for periods much shorter than the period of the input signal.

16. Signal translation means as defined in claim 15 in which the predetermined times are equal to the pulse width of the input signal in the event the pulse width of the input signal is in excess of the delay time of the delay line.

17. Signal translation means as defined in claim 15 or 16, in which the second switching means is comprised of a second plurality of groups of diode gates, the inputs of the latter gates respectively connected in a circuit to a corresponding said capacitor, all of the outputs of the gates of each individual group being connected together and to respective ones of said second predetermined points on the output delay line, each capacitor being connected via a buffer amplifier to a corresponding input of one of the diode gates of the second plurality of gates, and further including second means for enabling all of the correspondingly ranked gates in all the groups of the second plurality of gates together, in sequence, for periods much shorter than the period of the input signal, whereby an output signal is reconstructed in the output delay line, corresponding to the signal carried by the input delay line.

18. Signal translation means comprising an input delay line means for distributing said signal, means for sampling the amplitude of the distributed signal at predetermined points along the input delay line means, means for storing the samples from said sampling means, output delay line means similar to said input delay line means, and means for applying samples stored by said storing means to the output delay line means at points corresponding to said predetermined points along said input delay line means.

19. Signal translation means as defined in claim 18, wherein said storing means comprises a plurality of memory units associated with each of said predetermined points.

20. Signal translation means as defined in claim 18, wherein said sampling means comprises a plurality of sampling gates and a single sample drive pulse generator for activating all of said sampling gates.

21. Signal translation means as defined in claim 5 or 18 further including means for switching the samples from each predetermined point to the storing means at a rate of the Nyquist sample frequency divided by n, where n is the number of input delay line sampling points.

22. Signal translation means as defined in claim 18, in which the storing means is an analog memory.

23. Signal translation means as defined in claim 18, in which the storing means is comprised of a plurality of capacitors, each adapted to store one of said samples.

* * * * *